(12) United States Patent
Mao

(10) Patent No.: US 10,715,119 B2
(45) Date of Patent: Jul. 14, 2020

(54) LOW POWER FLIP-FLOP CIRCUIT

(71) Applicant: Little Dragon IP Holding LLC, Saratoga, CA (US)

(72) Inventor: Mingming Mao, Saratoga, CA (US)

(73) Assignee: Little Dragon IP Holding LLC, Saratoga, CA (US)

( * ) Notice: Subject to any disclaimer, the term of this patent is extended or adjusted under 35 U.S.C. 154(b) by 0 days.

(21) Appl. No.: 16/431,692

(22) Filed: Jun. 4, 2019

(65) Prior Publication Data

US 2019/0372563 A1   Dec. 5, 2019

Related U.S. Application Data

(63) Continuation-in-part of application No. 15/996,821, filed on Jun. 4, 2018, now Pat. No. 10,355,671.

(51) Int. Cl.
| | |
|---|---|
| *H03K 3/356* | (2006.01) |
| *H03K 3/3562* | (2006.01) |
| *H03K 3/012* | (2006.01) |
| *H03K 3/013* | (2006.01) |

(52) U.S. Cl.
CPC ......... *H03K 3/35625* (2013.01); *H03K 3/012* (2013.01); *H03K 3/013* (2013.01)

(58) Field of Classification Search
CPC ..... H03K 3/35625; H03K 3/012; H03K 3/013
USPC ........................................................ 327/203
See application file for complete search history.

(56) References Cited

U.S. PATENT DOCUMENTS

| | | | | | |
|---|---|---|---|---|---|
| 5,656,962 | A * | 8/1997 | Banik | ..................... | H03K 3/012 327/202 |
| 6,538,471 | B1 * | 3/2003 | Stan | ....................... | H03K 3/012 326/40 |
| 6,803,799 | B1 * | 10/2004 | Churchill | ............... | H03K 3/012 327/202 |
| 6,864,733 | B2 * | 3/2005 | Anshumali | ...... | H03K 3/356156 327/210 |
| 7,301,381 | B2 * | 11/2007 | Rhee | .................... | H03K 3/0372 327/201 |
| 8,432,188 | B2 * | 4/2013 | Jung | ................ | H03K 3/356156 326/58 |
| 8,749,287 | B2 * | 6/2014 | Uemura | ............... | H03K 3/0375 327/203 |
| 8,791,739 | B2 * | 7/2014 | Ramaraju | ........ | H03K 3/356156 327/201 |
| 2004/0032290 | A1 * | 2/2004 | Lundberg | ............... | G06F 9/3869 327/202 |
| 2005/0280459 | A1 * | 12/2005 | Inoue | .................... | H03K 3/011 327/203 |
| 2007/0080714 | A1 * | 4/2007 | Kim | ....................... | H03K 3/012 326/46 |

* cited by examiner

*Primary Examiner* — Ryan Jager
(74) *Attorney, Agent, or Firm* — Getech Law LLC; Jun Ye

(57) ABSTRACT

Aspects for a flip-flop circuit are described herein. As an example, the aspects may include a passgate, a passgate inverter, a leakage compensation unit, and an inverter. The passgate may be coupled between a flip-flop data input terminal and a first node. The passgate inverter and the inverter may be sequentially connected between the first node and a flip-flop data output terminal. The leakage compensation unit may be connected between the first node and the flip-flop data output terminal parallel to the passgate inverter and the inverter.

11 Claims, 6 Drawing Sheets

LOW POWER FLIP-FLOP CIRCUIT

BACKGROUND

Flip-flops may refer to sequential circuits that store either a "high" value (voltage high or logic one) or a "low" value (voltage low or logic zero). A flip-flop may store a next value that depends on the values of one or more input signals. Conventionally, a flip-flop may include data, clock, set, and/or reset input signals.

A Data (conventionally designated D) input signal is typically clocked into the flip-flop on receipt of a given clock edge. Set (conventionally designated S) and Reset (conventionally designated R) input signals are generally unclocked, meaning that when the set or reset signal becomes active (e.g., goes high), the stored value changes immediately, without waiting for the arrival of a clock edge. Flop is usually a master-slave latch structure. Each latch is active (transparent) during either logic high or logic low phase (not edge). At the rising (trigger) edge, the master latch will latch the input and store the data value, the slave latch will become active (transparent) and pass the value to the output. Assume the active phase for the master latch is 0, then at the falling edge, maser latch will become active (transparent) to accept the next value and slave latch will latch what was latched by the master latch to continue output the value that was stored in the master latch. So output will change only at each triggering edge. An active set signal forces the stored value (conventionally designated Q) high, despite the previously stored value. An active reset signal forces the stored value Q low, despite the previously stored value. In set/reset flip-flops (i.e., flip-flops having both set and reset input signals) the set and reset signals are typically restricted such that at most one of them can be active at any given time. Since flip-flop is a fundamental building block of modern digital designs, there is always a need to minimize its power consumption and area. A flop-flop design is proposed that would reduce its power consumption and area compared to conventional designs.

SUMMARY

The following presents a simplified summary of one or more aspects in order to provide a basic understanding of such aspects. This summary is not an extensive overview of all contemplated aspects and is intended to neither identify key or critical elements of all aspects nor delineate the scope of any or all aspects. Its sole purpose is to present some concepts of one or more aspects in a simplified form as a prelude to the more detailed description that is presented later.

The present disclosure presents examples of flip-flop circuits. An example flip-flop circuit may include a flip-flop data input terminal and a flip-flop data output terminal. The example flip-flop circuit may further include a clock terminal that provides a first clock signal and a second clock signal, wherein the second clock signal is an inverse of the first clock signal. In addition, the example flip-flop circuit may include a passgate coupled between the flip-flop data input terminal and a first node. The passgate may include a first P-channel gate terminal and a first N-channel gate terminal. The first P-channel gate terminal and the first N-channel gate terminal may be respectively connected to the first clock signal and the second clock signal.

The example flip-flop circuit may further include a passgate inverter coupled between the first node and a second node. The passgate inverter may include a first P-channel transistor, a second P-channel transistor, a first N-channel transistor, and a second N-channel transistor. The first P-channel transistor and the second N-channel transistor may be connected to the first node. The second P-channel transistor may be connected to the second clock signal and the first N-channel transistor may be connected to the first clock signal.

The example flip-flop circuit may further include an inverter connected between the second node and the flip-flop data output terminal.

Further still, the example flip-flop circuit may include one or more leakage compensation units coupled between the first node and the flip-flop data output terminal. Each of the leakage compensation units may include a third P-channel transistor and a third N-channel transistor.

To the accomplishment of the foregoing and related ends, the one or more aspects comprise the features herein after fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Various aspects are now described with reference to the drawings. In the following description, for purpose of explanation, numerous specific details are set forth in order to provide a thorough understanding of one or more aspects. It may be evident, however, that such aspect(s) may be practiced without these specific details.

Figure 1:
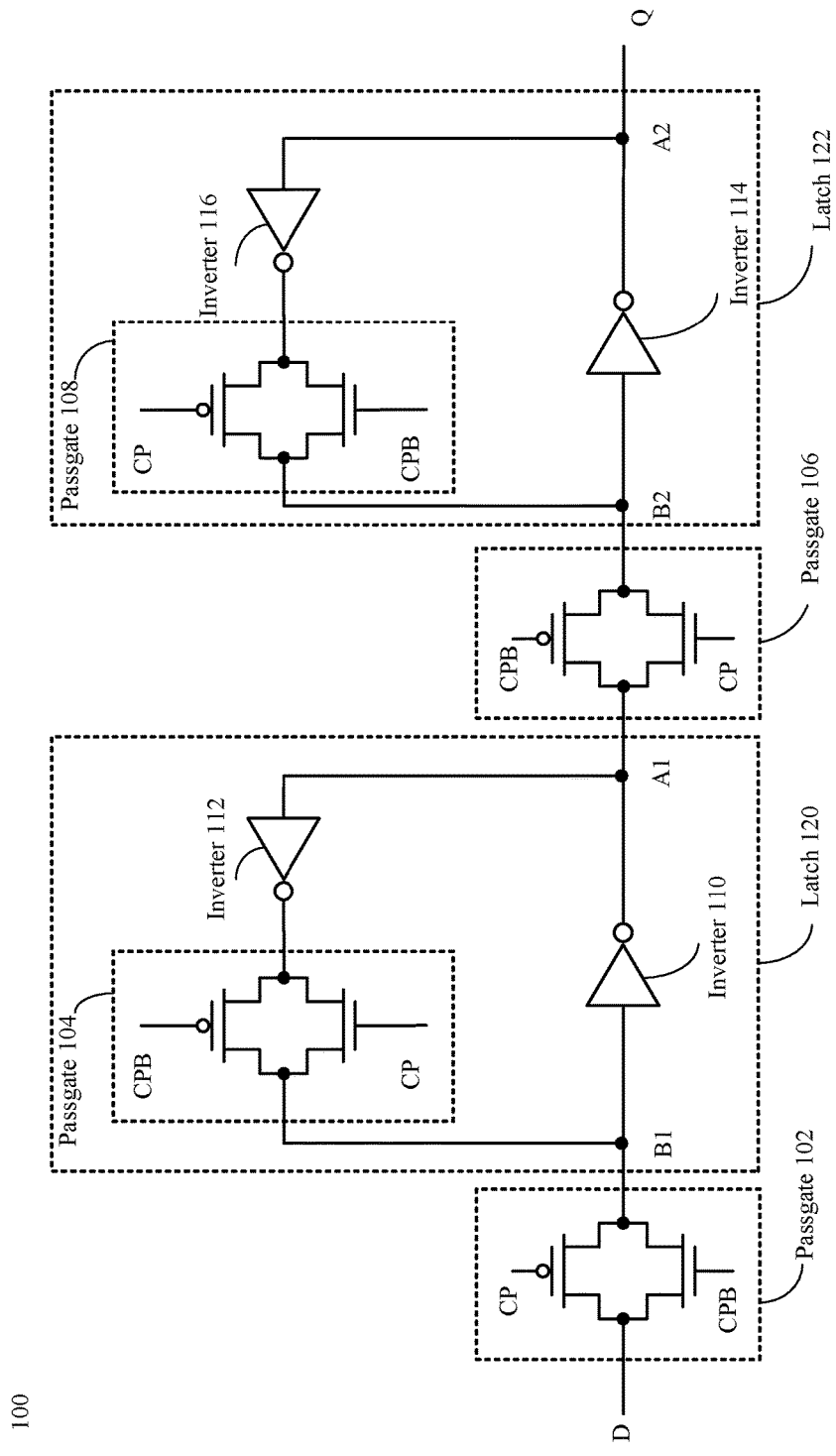
FIG. 1 is a block diagram illustrating a conventional flip-flop circuit.

Flip-flop circuits may be designed to include two latches separated by passgates. For example, FIG. 1 shows a conventional flip-flop circuit 100 that include a passgate 102, a latch 120, a passgate 106, and a latch 122, which are sequentially coupled together. A passgate may also be referred to as a pass gate or a transmission gate. In accordance with the signal coupled to the N-channel terminal and the P-channel of a passgate, a passgate may be either in a closed state (may also be referred to as "connected state") or an open state. For example, the passgate 102 of the flip-flop circuit 100 is coupled between a data input terminal (shown as "D" in FIG. 1) and the latch 120. Another passgate 106 is coupled between the latch 120 and the latch 122. The latch 120 includes a pair of cross-coupled inverters 110 and 112 and a passgate 104 coupled to the inverter 112 in the feedback. Similar to the latch 120, the latch 122 includes another pair of cross-coupled inverters 114 and 116 and a passgate 108 coupled to the inverter 116. As shown in FIG. 1, the clock signal CK is inverted to generate inverted clock signal CPB that is provided to respective N-channel terminals of the passgates 102, 104, 106, and 108. The inverted clock signal CPB may be further inverted to generate clock pulse CP. The clock pulse CP may be provided to the respective P-channel terminals of the passgates 102, 104, 106, and 108.

In some examples, the conventional flip-flop circuit of FIG. 1 may function properly to generate correct signals. However, the passgates 104 and 108 and the inverters 112 and 116 may cause high power consumption. The extra power consumption comes from additional loading on the clock distribution network by the passgate and the logic operation of the inverter. Thus, another conventional flip-flop circuit without the feedback structure was proposed.

Figure 2:
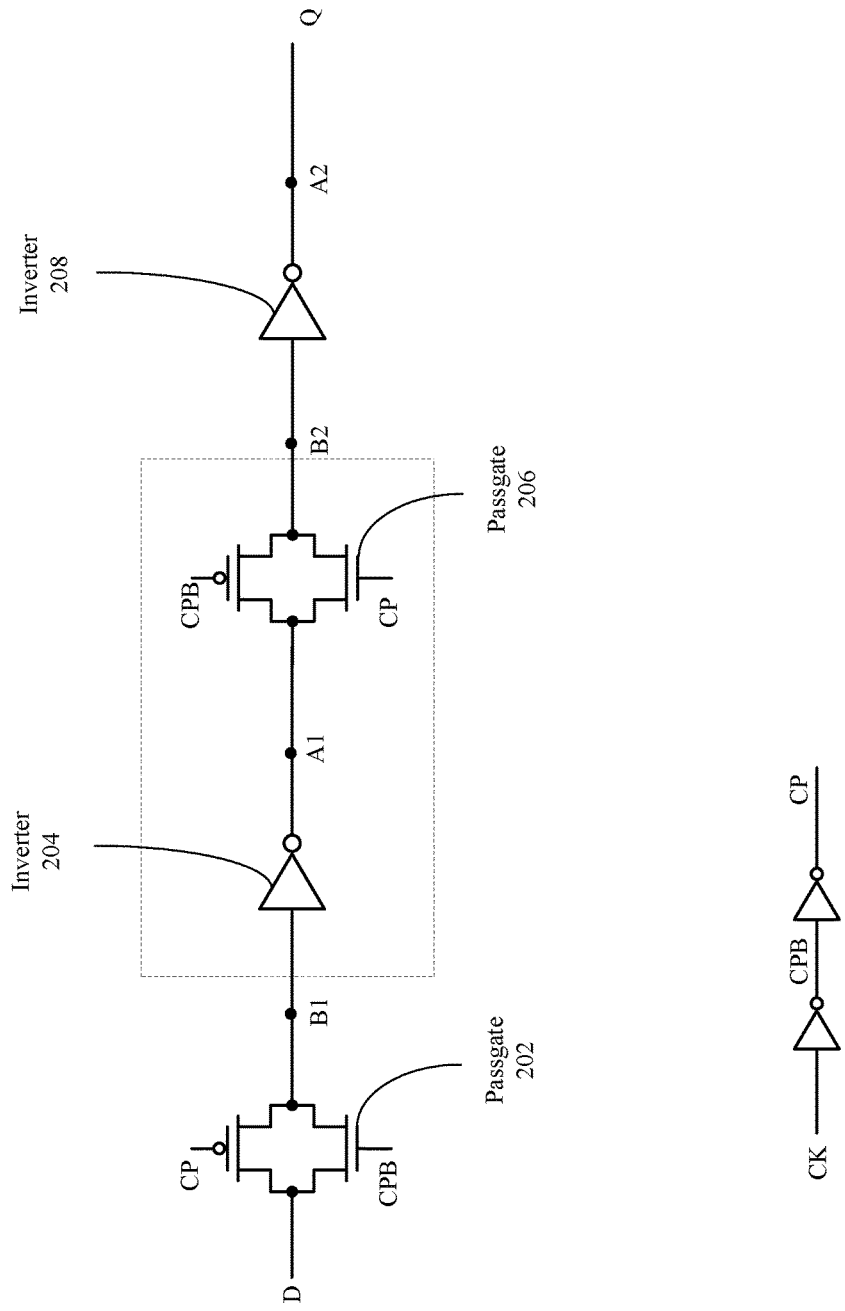
FIG. 2 is a block diagram illustrating another conventional flip-flop circuit.

FIG. 2 is a block diagram illustrating another conventional flip-flop circuit 200. The flip-flop circuit 200 may include a passgate 202, an inverter 204, a passgate 206, and an inverter 208. The passgate 202, the inverter 204, the passgate 206, and the inverter 208 may be sequentially connected. As show, the flip-flop 200 does not include a feedback loop between the node B1 and the node B2. As a result, the voltage at the node B1 may be unstable due to leakage from or to the passgate 202 and cause incorrect data values at the data output terminal of the flip-flop circuit 200 (shown as "A2" and "Q").

Figure 3:
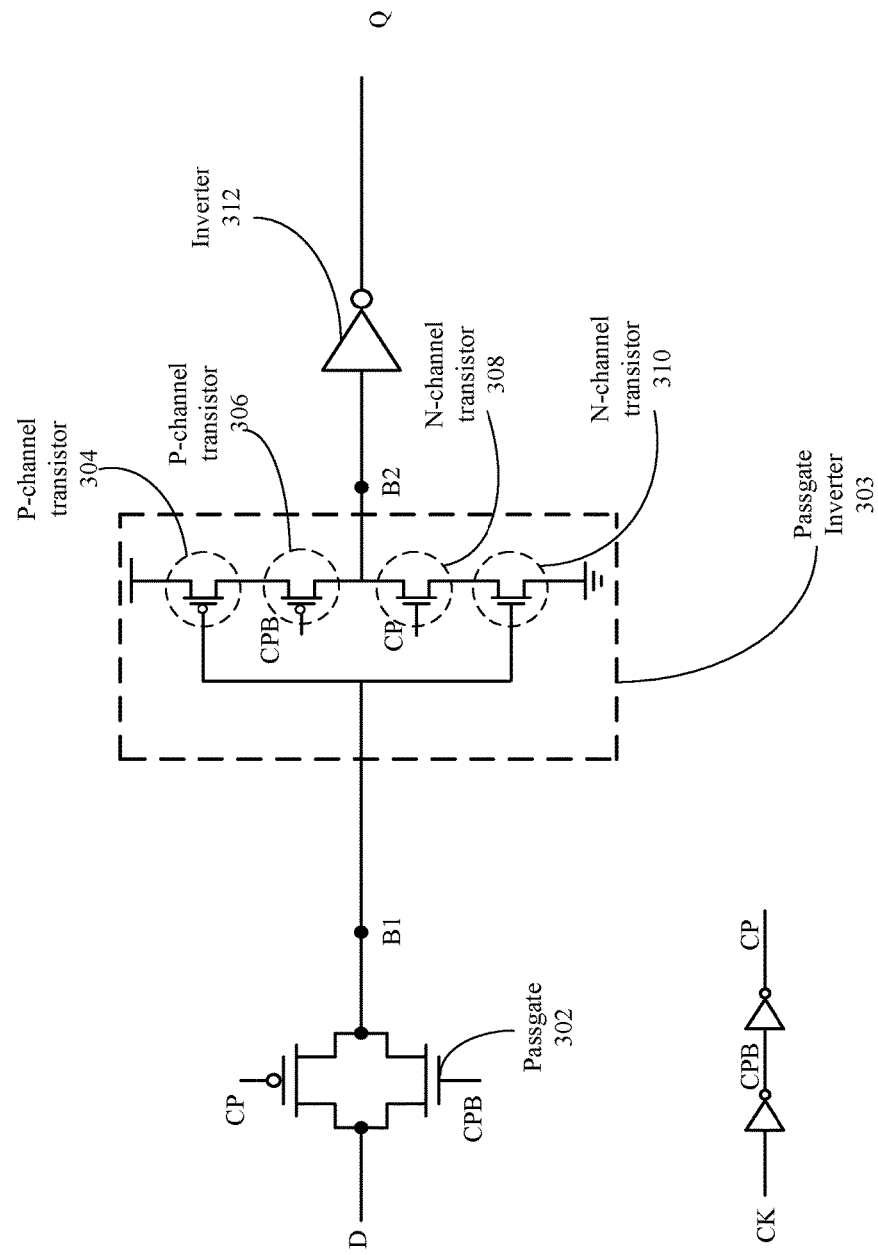
FIG. 3 is a block diagram illustrating another conventional flip-flop circuit.

FIG. 3 is a block diagram illustrating another conventional flip-flop circuit 300. As depicted, the flip-flop circuit 300 may include a passgate 302, a passgate inverter 303, and an inverter 312. In some examples, the passgate 302, the passgate inverter 303, and the inverter 312 may be sequentially connected. The passgate inverter 303 may be connected between the passgate 302 and the inverter 312. In some examples, the passgate inverter 303 may include two P-channel transistors 304 and 306 and two N-channel transistors 308 and 310. A gate terminal of the P-channel transistor 304 and a gate terminal of the N-channel transistor 310 may be connected to the node B1. A gate terminal of the P-channel transistor 306 may be connected to an inverted clock signal CPB and a gate terminal of the N-channel transistor 308 may be connected to a clock signal CK or a clock pulse CP.

Further, a source terminal or a drain terminal of the P-channel transistor 304 may be connected to a supply terminal VDD. A source terminal or a drain terminal of the N-channel transistor 310 may be connected to a ground terminal. The P-channel transistor 306 and the N-channel transistor 308 may be connected via the source terminals or the drain terminals thereof and may be further connected to the node B2.

The flip-flop circuit 300 may lead to lower power consumption relative to the flip-flop circuit 200. Further, in a time interval when the clock pulse CP or clock signal CK is low ("0") and the inverted clock signal CPB is high ("1"), leakage current from the P-channel transistors 304 and 306 may cause the voltage at the node B2 to increase; however, leakage current from the N-channel transistors 308 and 310 may cause the voltage at the node B2 to decrease. As such, the voltage at the node B2 may be stabilized for a period. The period may be extended with additional capacitance. However, the voltage at the node B1 may be relatively unstable as there is no feedback structure to stabilize the voltage at the node B1.

Figure 4:
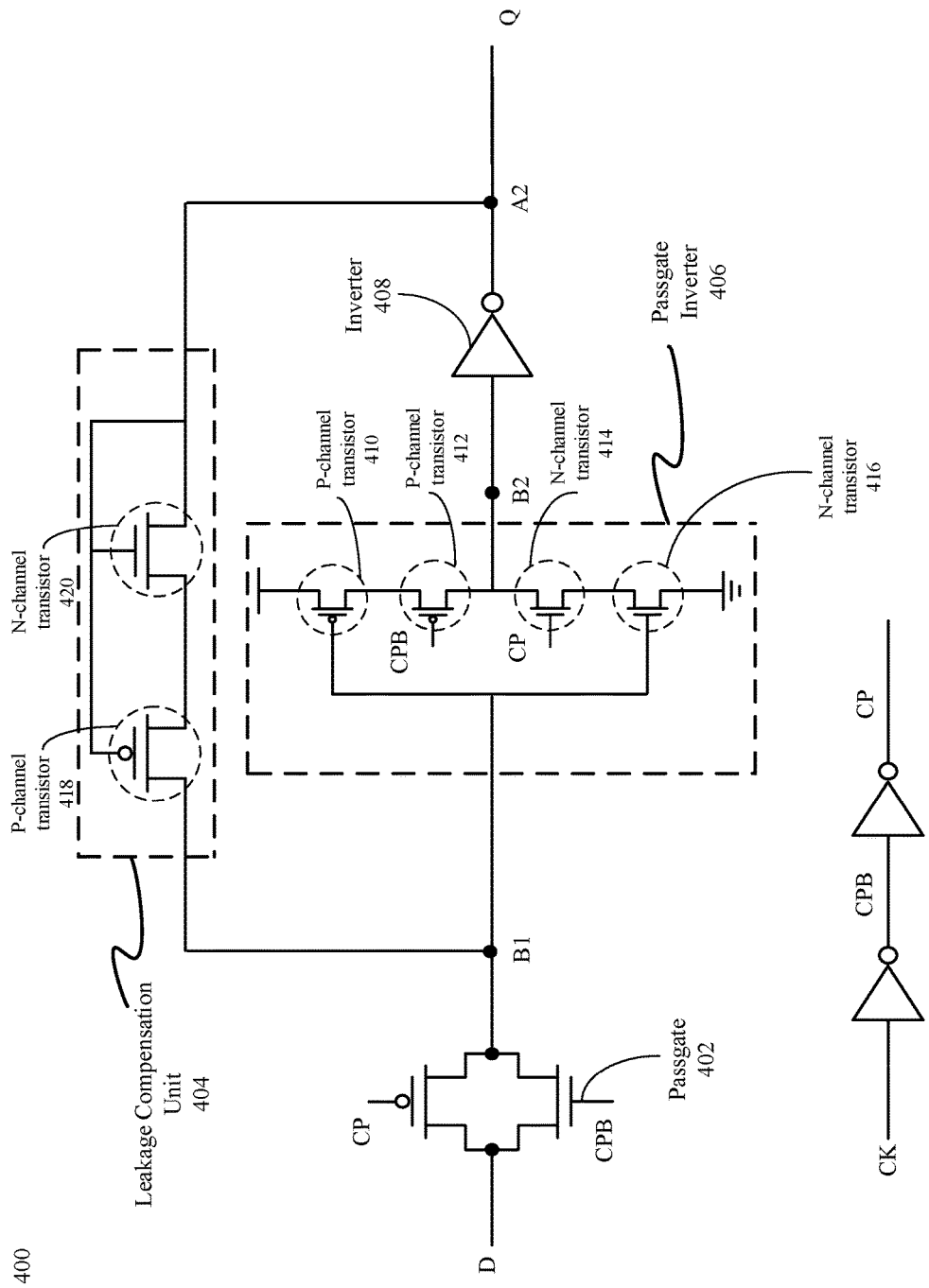
FIG. 4 is a block diagram illustrating a flip-flop circuit in accordance with one embodiment of this invention.

FIG. 4 is a block diagram illustrating a flip-flop circuit 400 in accordance with one embodiment of this invention. As depicted, the flip-flop circuit 400 may include a passgate 402, a leakage compensation unit 404, a passgate inverter 406, and an inverter 408. The passgate 402, the passgate inverter 406, and the inverter 408 may be sequentially connected. In other words, the passgate 402 may be connected between a flip-flop data input terminal and a first node B1. The passgate inverter 406 may be connected between the first node B1 and a second node B2. The inverter 408 may be connected between the second node B2 and a flip-flop data output terminal A2/Q. The leakage compensation unit 404 may be connected parallel to the passgate inverter 406 and the inverter 408 between the flip-flop data output terminal A2/Q and the first node B1.

In some examples, a P-channel terminal of the passgate 402 may be coupled to the clock pulse CP signals and a N-channel terminal of the passgate 402 may be coupled to the inverted clock signals CPB.

Similar to the passgate inverter 306, the passgate inverter 406 may also include a P-channel transistor 410, a P-channel transistor 412, a N-channel transistor 414, and a N-channel transistor 416. In some examples, the P-channel transistor 410, the P-channel transistor 412, the N-channel transistor 414, and the N-channel transistor 416 may be sequentially connected. A gate terminal of the P-channel transistor 410 and a gate terminal of the N-channel transistor 416 may be connected to the first node B1. A source or drain terminal of the P-channel transistor 410 may be connected to a supply terminal VDD; a source or drain terminal of the N-channel transistor 416 may be connected to a ground terminal.

Further to the examples, a gate terminal of the P-channel transistor 412 may be connected to the inverted clock signal CPB and a gate terminal of the N-channel transistor 414 may be connected to the clock pulse CP. The P-channel transistor 412 and the N-channel transistor 414 may be connected with the second node B2 via the source or drain terminals.

Unlike the flip-flop circuit 300, the flip-flop circuit 400 may include at least one leakage compensation unit 404 connected between the first node B1 and the flip-flop data output terminal A2/Q. In at least one example, the leakage compensation unit 404 may include a P-channel transistor 418 and a N-channel transistor 420 that may be sequentially connected. Gate terminals of the P-channel transistor 418 and the N-channel transistor 420 may be connected to the flip-flop data output terminal A2/Q. A source or drain terminal of the P-channel transistor 418 may be connected to the first node B1.

In a time interval when the clock pulse CP is high ("1") and the inverted clock signal CPB is low ("0"), leakage current from the passgate 402 may cause the voltage at the first node B1 to increase. Thus, the voltages at the first node B1 and the flip-flop data output terminal A2/Q may no longer be equal, which may further cause leakage at the leakage compensation unit 404. The leakage at the leakage compensation unit 404 may then decrease the voltage at the first node B1. Thus, the voltage at the first node B1 may be adjusted to a correct value.

Similarly, when the leakage current from the passgate 402 cause the voltage at the first node B1 to decrease, the voltages at the first node B1 and the flip-flop data output terminal A2/Q may no longer be equal. The leakage at the leakage compensation unit 404 may increase the voltage at the first node B1. The voltage at the first node B1 may then be similarly adjusted to a correct value.

Figure 5:
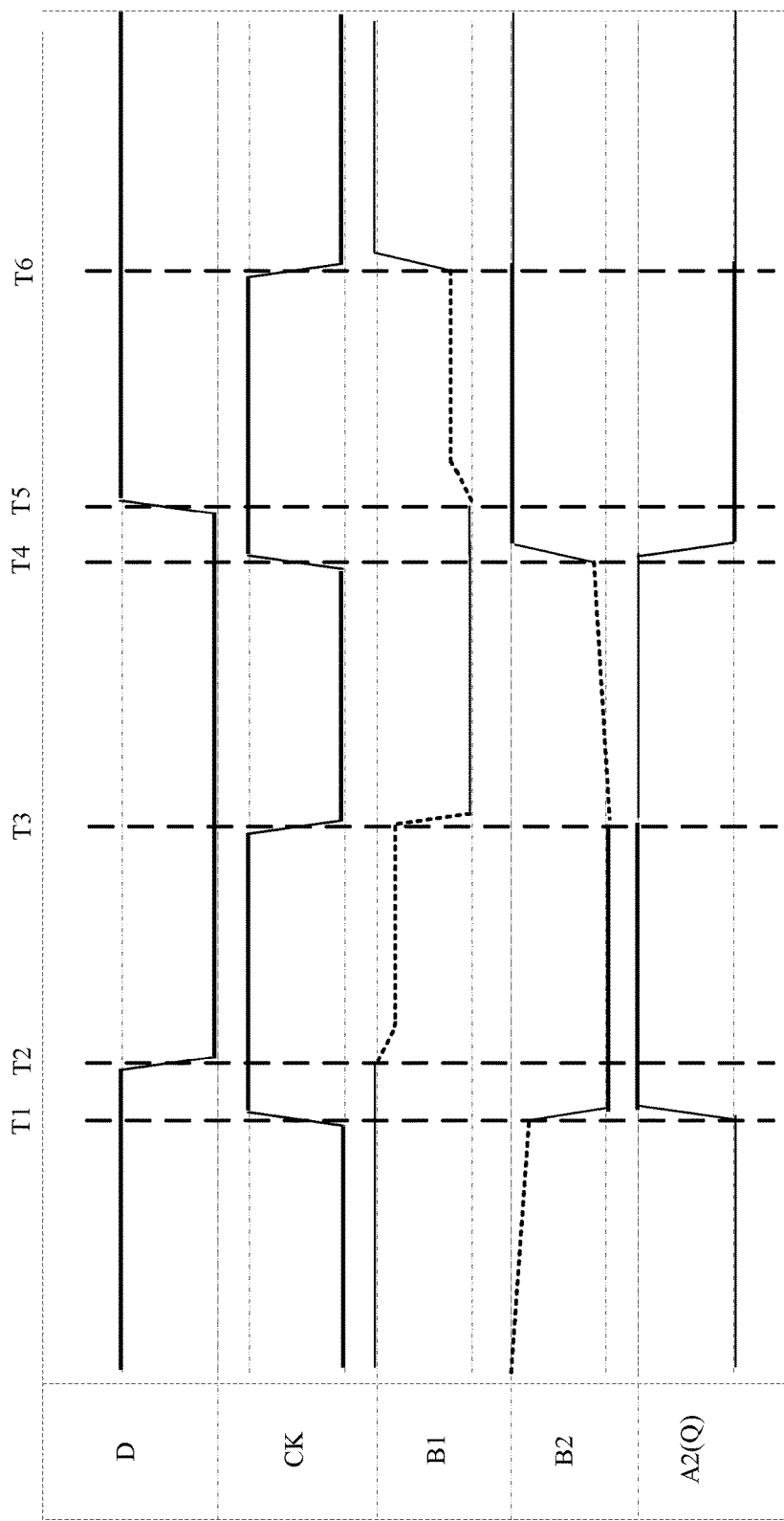
FIG. 5 is a timing diagram illustrating signals of the flip-flop circuit of FIG. 4.

FIG. 5 is a timing diagram illustrating signals of the flip-flop circuit of FIG. 4.

As depicted, prior to time point T1, due to leakage current from the passgate inverter 406, voltage at the node B2 may drop gradually till the time point T1. At time point T2, the clock signal CK and the clock pulse CP are high and the inverted clock signal CPB is low, the leakage current at the passgate 402 may cause the voltage at the first node B1 to decrease. However, the difference of voltages at the first node B1 and the flip-flop data output terminal A2/Q may cause leakage at the leakage compensation unit 404 and further prevent the voltage at the first node B1 from dropping (as shown in dotted line between T2 and T3). Thus, the voltage at the first node B1 may be maintained as high from the time point T2 to the time point T3 as illustrated.

Similarly, between time points T3 and T4, due to leakage current from the passgate inverter 406, voltage at the node B2 may rise gradually till time point T4.

Further, between time points T5 and T6, the clock signal CK and the clock pulse CP are high and the inverted clock signal CPB is low, the leakage current at the passgate 402 may cause the voltage at the first node B1 to increase. The difference of voltages at the first node B1 and the flip-flop data output terminal A2/Q may cause leakage at the leakage compensation unit 404 and further prevent the voltage at the first node B1 from increasing (as shown in dotted line between T5 and T6).

Figure 6:
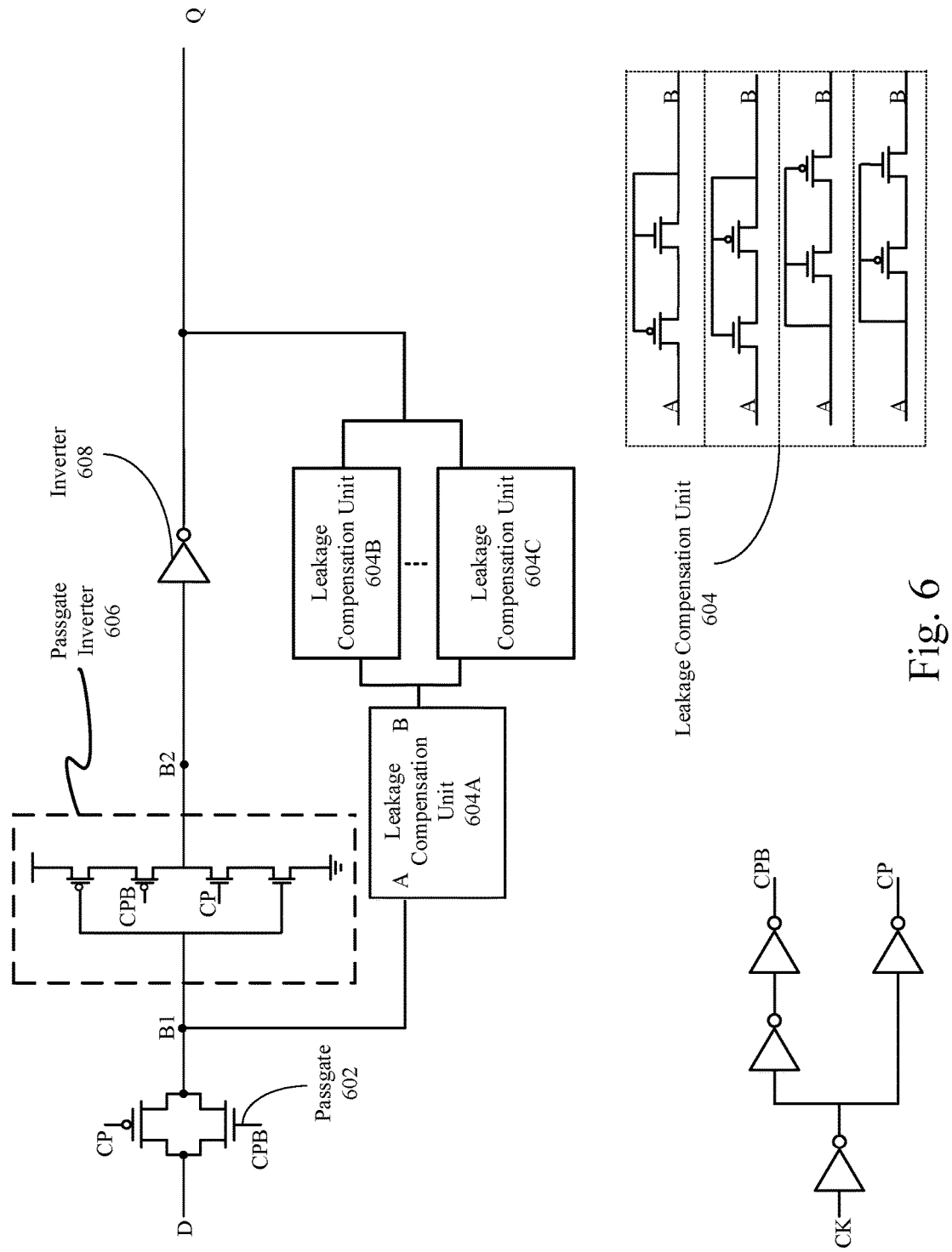
FIG. 6 is a block diagram illustrating a flip-flop circuit in accordance with one or more embodiments of this inventions.

FIG. 6 is a block diagram illustrating a flip-flop circuit 600 in accordance with one or more embodiments of this inventions.

As depicted, the flip-flop circuit 600 may include similar components as the flip-flop circuit 400 in accordance with FIG. 4. The flip-flop circuit 600 may include one or more leakage compensation units 604. For example, the leakage compensation units may be connected sequentially, parallelly, or in any arrangement. Each of the leakage compensation units 604 may include a P-channel transistor and a N-channel transistor. The gate terminals of the P-channel transistor and the N-channel transistor may be connected together to the first node B1, the flip-flop data output terminal A2/Q, or other leakage compensation units.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described herein that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

I claim:

1. A flip-flop circuit, comprising:
   a flip-flop data input terminal and a flip-flop data output terminal;
   a clock terminal that provides a first clock signal and a second clock signal, wherein the second clock signal is an inverse of the first clock signal;
   a passgate coupled between the flip-flop data input terminal and a first node, wherein
      the passgate includes a first P-channel gate terminal and a first N-channel gate terminal, and
      the first P-channel gate terminal and the first N-channel gate terminal are respectively connected to the first clock signal and the second clock signal;
   a passgate inverter coupled between the first node and a second node,
      wherein the passgate inverter includes a first P-channel transistor, a second P-channel transistor, a first N-channel transistor, and a second N-channel transistor,
      wherein the first P-channel transistor and the second N-channel transistor are connected to the first node,
      wherein the second P-channel transistor is connected to the second clock signal, and
      wherein the first N-channel transistor is connected to the first clock signal;
   an inverter coupled between the second node and the flip-flop data output terminal; and
   one or more leakage compensation units coupled between the first node and the flip-flop data output terminal,
      wherein each of the one or more leakage compensation units includes a third P-channel transistor and a third N-channel transistor,
      wherein gate terminals of the third P-channel transistor and the third N-channel transistor are connected to the flip-flop data output terminal.

2. The flip-flop circuit of claim 1, wherein a gate terminal of the first P-channel transistor is connected to the first node.

3. The flip-flop circuit of claim 1, wherein a gate terminal of the second N-channel transistor is connected to the first node.

4. The flip-flop circuit of claim 1, wherein a gate terminal of the second P-channel transistor is connected to the second clock signal.

5. The flip-flop circuit of claim 1, wherein a gate terminal of the first N-channel transistor is connected to the first clock signal.

6. The flip-flop circuit of claim 1,
   wherein the third P-channel transistor is connected to the first node, and
   wherein the third N-channel transistor is connected to the flip-flop data output terminal.

7. The flip-flop circuit of claim 1,
   wherein the third N-channel transistor is connected to the first node, and
   wherein the third P-channel transistor is connected to the flip-flop data output terminal.

8. The flip-flop circuit of claim 1,
   wherein drain terminals of the third P-channel transistor and the third N-channel transistor are connected to the first node,
   wherein the third N-channel transistor is connected to the first node, and wherein the third P-channel transistor is connected to the flip-flop data output terminal.

9. The flip-flop circuit of claim 1,
wherein the drain terminals of the third P-channel transistor and the third N-channel transistor are connected to the first node,
wherein the third P-channel transistor is connected to the first node, and
wherein the third N-channel transistor is connected to the flip-flop data output terminal.

10. The flip-flop circuit of claim 1, wherein the one or more leakage compensation units are connected sequentially.

11. The flip-flop circuit of claim 1, wherein the one or more leakage compensation units are connected parallelly.

* * * * *